United States Patent [19]

Brolin

[11] 4,308,502
[45] Dec. 29, 1981

[54] THRESHOLD DETECTION

[75] Inventor: Stephen J. Brolin, Livingston, N.J.

[73] Assignee: Bell Telephone Laboratories, Incorporated, Murray Hill, N.J.

[21] Appl. No.: 135,251

[22] Filed: Mar. 31, 1980

[51] Int. Cl.³ .............................................. H03K 5/153
[52] U.S. Cl. .................................. 328/151; 307/350; 307/362; 328/146; 328/162
[58] Field of Search ............... 307/350, 352, 353, 354, 307/362, 247 A; 328/114, 117, 146, 147, 149, 150, 151, 132, 135, 162, 165; 340/511, 660, 661

[56] References Cited

U.S. PATENT DOCUMENTS 4,198,579 4/1980 Ebihara et al. ................ 307/247 A Primary Examiner—John Zazworsky
Attorney, Agent, or Firm—Robert O. Nimtz

[57] ABSTRACT

A simple and inexpensive direct current voltage level detector is shown which has a significant immunity against interfering alternating current signal components. The output of a standard analog threshold detector is successively sampled by clock pulses having twice the repetition rate of the frequency of the expected interfering alternating current components. By requiring two successive samples to be above the threshold of detection, immunity is provided against false detection due to temporarily exceeding the threshold level due solely to the positive excursion of the interfering alternating current components. Simple clock-driven flip-flops are used for the sampling and a simple logical AND gate is used to detect the successive samples.

4 Claims, 2 Drawing Figures

THRESHOLD DETECTION

BACKGROUND OF THE INVENTION

1. Field of the Invention

This invention relates to voltage detection circuits and, more particularly, to the detection of direct current voltages in the presence of interfering alternating current signals.

2. Description of the Prior Art

It has been the practice to detect particular levels of direct current voltage by simple threshold responsive circuits. If alternating current components were present which might interfere with the proper detection of the direct current voltage threshold, it was common to provide alternating current filter circuits of lesser or greater complexity. It is necessary to reduce the alternating current components to a sufficiently low amplitude level so as to avoid any substantial interference with the direct current voltage detection. Unfortunately, however, such filter circuits are normally composed of discrete components. Indeed, even simple filters, such as resistive-capacitive filters, required a capacitor which had to be realized as a discrete component. Such discrete components are large, bulky, expensive to provide and are incompatible with modern integrated circuit technology. This problem is aggravated with more complex filters requiring inductive as well as capacitive elements and requiring a larger number of such elements.

On the other hand, digital logic circuitry which can be realized in integrated circuit form has become smaller, more compact and less expensive as integrated circuit technology has improved. In fact, it has come to the point in certain types of design where fairly complex logical circuitry can be economically substituted for simple, discrete current components. This tendency has led to the digital filter technology and is likely to continue on into the foreseeable future. Unfortunately, up to the present time, analog voltage detection has not been able to obtain the benefits of such integrated circuit technology.

SUMMARY OF THE INVENTION

In accordance with the illustrative embodiment of the present invention, a direct current voltage threshold detector is realized in which immunity against alternating current interference is achieved by the use of digital logic circuitry rather than by analog discrete component filter circuits.

More particularly, digital logic circuitry is used to sample the output of an analog threshold detector in approximate synchronism with interfering alternating current components. If the successive comparisons take place about every 180 degrees (or other oppositely poled half-cycles) of the interfering alternating current signal, a simple comparison of successive oppositely poled half-cycle samples serves to immunize the output against the interfering alternating current components. That is, if the interfering alternating current component places the composite signal above the level of threshold detection on one half-cycle of the alternating current, then the next successive half-cycle will produce a composite signal below the threshold. By comparing successive half-cycle samples, it is possible to prevent threshold output signals when the direct current component itself is below threshold level and the composite signal rises above the threshold level due only to the interfering alternating current component. Phase lock is not necessary, however, since the successive comparisons can take place at any point in the half-cycle.

In some applications, such as telephone circuits, it is known that certain types of alternating current signal components will be present on the telephone line. Such alternating current components arise from 20-Hz ringing signals which are sometimes applied to the line and from 60-Hz induced voltages from alternating current power lines adjacent to the telephone lines. Thus, the frequency of the interfering signal is often known and this knowledge can be taken advantage of by utilizing a signal of approximately twice the interfering frequency to sample the analog threshold detection output. This is particularly important for ringing signal interference since telephone ringing signals usually have peak amplitudes which are comparable to or in excess of normal direct current signaling levels.

It is an advantage of the present invention that the digital logic circuitry required for immunization against alternating current interference can be realized in integrated circuit form and thus be more compact and less expensive than the alternative analog filter circuitry.

DETAILED DESCRIPTION

Figure 1:
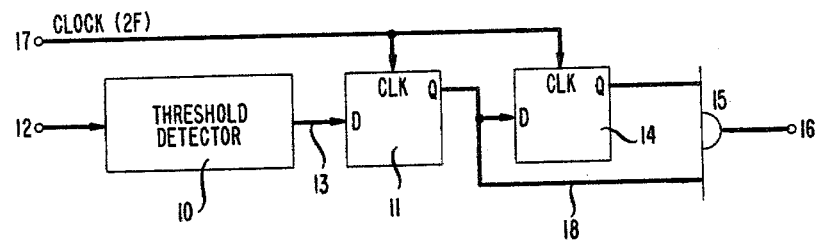
FIG. 1 is a detailed block diagram of a direct current voltage detector in accordance with the present invention.

Referring more particularly to FIG. 1, there is shown a detailed block diagram of a direct current voltage threshold detection circuit comprising a threshold detector 10, the output of which is applied to the D input of a flip-flop circuit 11. Threshold detector 10 may comprise any of the well-known forms of threshold detector circuitry which respond to a composite input signal at input terminal 12 and produce an output on output lead 13 whenever the signal at input terminal 12 rises above some preselected threshold value. A simple transistor switch with a preselected bias level will perform this function as well as a differential amplifier having a preselected voltage as one input.

The Q output of flip-flop 11 is applied to the D input of flip-flop 14 and also as one input to AND gate 15. The Q output of flip-flop 14 comprises the other input to AND gate 15. The output of AND gate 15 appears at terminal 16 and comprises the output of the threshold detection circuit.

Flip-flops 11 and 14 are clocked by clock signals at input terminal 17. If the frequency of interfering alternating current signal components at input terminal 12 is known, then a clock signal is applied at terminal 17 which has a repetition rate equal to twice the frequency of the interfering alternating current signal. As previously described, telephone circuits are known to exhibit interference at the 20-Hz ringing signal frequency. Thus, the repetition rate of the clock signals at terminal 17 might well comprise 40 pulses per second. In the alternative, the clock signal at input terminal 17 might be derived directly from the alternating current component itself which is present at terminal 12. This could be simply accomplished by removing the direct current component from the signal at terminal 12 and utilizing the remaining alternating current signal component to drive a multiply-by-two circuit, the output of which is connected to terminal 17.

Figure 2:
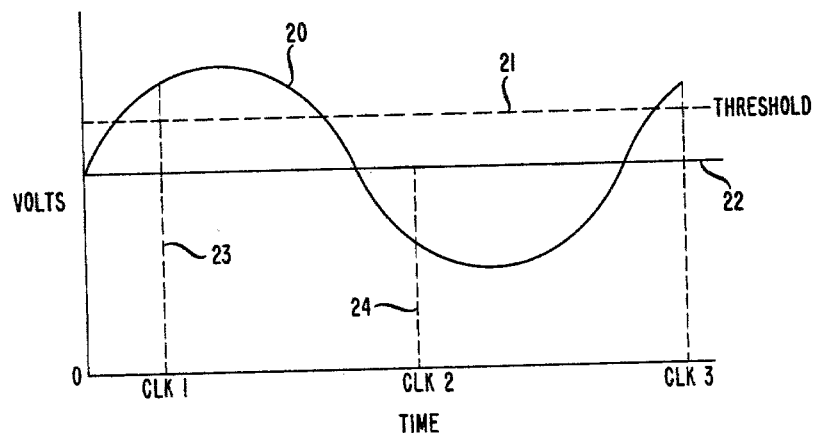
FIG. 2 is a graphical representation of a composite alternating current and direct current signal, showing the level of threshold detection, and which is useful in explaining the operation of the circuit of FIG. 1.

In any event, it is to be noted that the signal at terminal 17 has a frequency which is twice the frequency of the interfering alternating current signal but need not be synchronized in phase with the interfering alternating current signal. As can better be seen in FIG. 2, the clock pulses, so long as they occur every 180 degrees (or 180 degrees +360 n, where n is an integer) of the interfering signal, will provide samples of a composite signal 20 which are successively above and below the threshold level 21 no matter what the phase of the clock pulses. In FIG. 2 the voltage level 22 represents the direct current voltage component of the composite signal 20. It is this direct current voltage component 22 which must rise above threshold 21 before an output signal is produced. It should be noted that the threshold 21 can be set below the maximum threshold desired in order to accommodate alternating signal components which might cause an excursion below the threshold on alternate half-cycles.

Returning to FIG. 1, the clock pulses at terminal 17 clock the flip-flop 11 to produce an output of lead 18 only if a clock pulse coincides in time with an output from detector 10 on lead 13. This would correspond to the clock pulse at time 23 in FIG. 2. The output on lead 18 remains and is applied to the D input of flip-flop 14 such that, upon the arrival of a next clock pulse at input terminal 17, flip-flop 14 is in a condition to be triggered. However, if at this time the output of threshold detector 10 is no longer present, flip-flop 11 will have returned to its quiescent state and an output no longer appears on lead 18. Thus, AND gate 15 is not fully enabled and no output appears at output terminal 16.

On the other hand, if the output of threshold detector 10 persists between two successive clock pulses at terminal 17, then both flip-flop 11 and flip-flop 14 will be set to provide Q outputs. Under this condition, both flip-flop 11 and flip-flop 14 will produce outputs to AND gate 15, AND gate 15 will thereby be fully enabled and will provide an output signal at output terminal 16.

It can be seen that the circuit of FIG. 1 operates to provide a threshold detection output which is substantially immune to interfering alternating signal components at half the frequency of the clock pulses at input terminal 17. Since digital logic circuitry, such as flip-flops 11 and 14 and AND gate 15, is simple, inexpensive and compact to realize in integrated circuit form, it is often a desirable alternative to providing alternating current filter circuits at the input to threshold detector 10.

It will be noted that the circuit of FIG. 1 serves to immunize against alternating current components which might temporarily raise the level of the composite signal above the desired threshold level. The circuit of FIG. 1, however, will not serve to immunize against alternating current components which temporarily reduce the composite signal below the threshold level. If such immunization is desirable, AND gate 15 can be replace by an OR gate so that an output is produced at terminal 16 when the threshold is exceeded on either half-cycle of the composite signal.

It will also be noted that threshold detection circuitry is often equipped to prevent false detection due to spurious transients by requiring that at least two consecutive samples be above the threshold level. In accordance with the present invention, significant alternating current suppression can be obtained simply by appropriately spacing these successive samples with regard to the frequency of the interfering alternating current signal.

I claim:

1. A direct current threshold level detector for detecting a direct current threshold level in the presence of interfering alternating current components and including a direct current threshold level detector (10)
   characterized by
   a source of clock pulses (17) at a repetition rate equal to twice the frequency of said interfering alternating current components,
   means for sampling the output of said level detector with said clock pulses (11,14), and
   means for detecting the presence to two successive outputs from said sampling means (15).

2. The direct current threshold level detector according to claim 1
   characterized in that
   said sampling means comprises a pair of cascaded flip-flops (11,14) triggered by the output of said level detector (10) and said clock pulses.

3. The direct current level detector according to claim 1 or 2
   characterized in that
   said means for detecting two successive outputs comprises coincident gating means (15).

4. The direct current threshold level detector according to claim 1
   characterized by
   a first flip-flop connected to said level detector,
   a second flip-flop connected to the output of said first flip-flop,
   means for applying said clock pulses to said first and said second flip-flops, and
   an AND gate connected to the outputs of said first and said second flip-flops.

* * * * *